United States Patent [19]

Arakawa

[11] Patent Number: 5,051,589
[45] Date of Patent: Sep. 24, 1991

[54] STIMULABLE PHOSPHOR SHEET AND ENERGY SUBTRACTION PROCESSING METHOD USING THE SAME

[75] Inventor: Satoshi Arakawa, Kanagawa, Japan

[73] Assignee: Fuji Photo Film Co., Ltd., Kanagawa, Japan

[21] Appl. No.: 510,914

[22] Filed: Apr. 18, 1990

[30] Foreign Application Priority Data

Apr. 20, 1989 [JP] Japan ............................. 1-101345

[51] Int. Cl.[5] .......................... G01T 1/16; G03C 5/17
[52] U.S. Cl. ................................ 250/327.2; 250/484.1
[58] Field of Search ............... 250/327.2 A, 327.2 B, 250/327.2 C, 327.2 D, 327.2 F, 327.2 G, 484.1 B

[56] References Cited

U.S. PATENT DOCUMENTS

| | | |
|---|---|---|
| 4,258,264 | 3/1981 | Kotera et al. |
| 4,276,473 | 6/1981 | Kato et al. |
| 4,315,318 | 2/1982 | Kato et al. |
| 4,387,428 | 6/1983 | Ishida et al. |
| 4,851,677 | 7/1989 | Hosoi et al. |
| 4,855,598 | 8/1989 | Ohgoda et al. |
| 4,896,037 | 1/1990 | Shimura et al. |

FOREIGN PATENT DOCUMENTS

| | | | |
|---|---|---|---|
| 56-11395 | 2/1981 | Japan . | |
| 61-5193 | 2/1986 | Japan . | |
| 61-251800 | 2/1986 | Japan . | |
| 61-251799 | 11/1986 | Japan . | |
| 2212492 | 9/1987 | Japan | 250/484.1 B |

Primary Examiner—Jack I. Berman
Assistant Examiner—Richard Hanig
Attorney, Agent, or Firm—Sughrue, Mion, Zinn, Macpeak and Seas

[57] ABSTRACT

Stimulable phosphor sheet comprises a plurality of stimulable phosphors which are mixed together or which take on the form of layers. The stimulable phosphors have different response speeds, with which light emission from the stimulable phosphors responds to stimulating rays which cause them to emit light in proportion to the amounts of radiation stored thereon during their exposure to radiation, and different radiation absorption characteristics which represent absorptivity with respect to energy levels of the radiation. Radiation images of an object are stored on the stimulable phosphor sheet. The stimulable phosphor sheet is then exposed to pulsed stimulating rays. Light emitted by the stimulable phosphor sheet is detected with different timings corresponding to the response speeds of the stimulable phosphors, and a plurality of image signals representing the radiation images are thereby obtained. Thereafter, subtraction processing for the radiation images is carried out on the plurality of the image signals.

9 Claims, 2 Drawing Sheets

FIG.3A
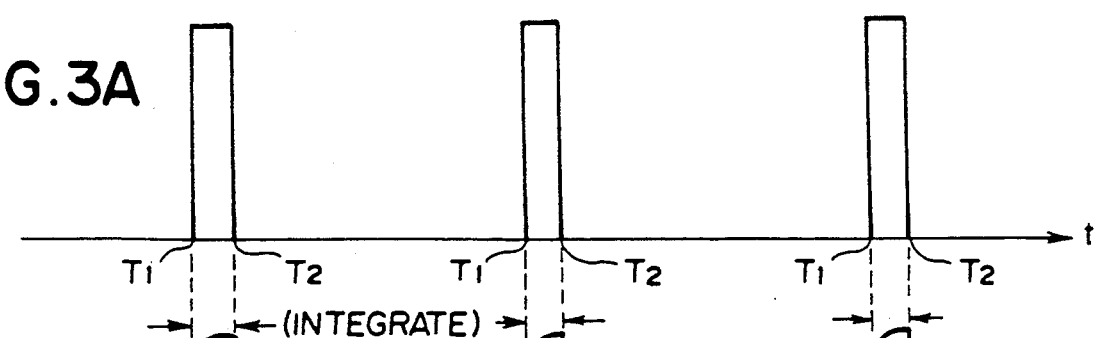
FIG.3B
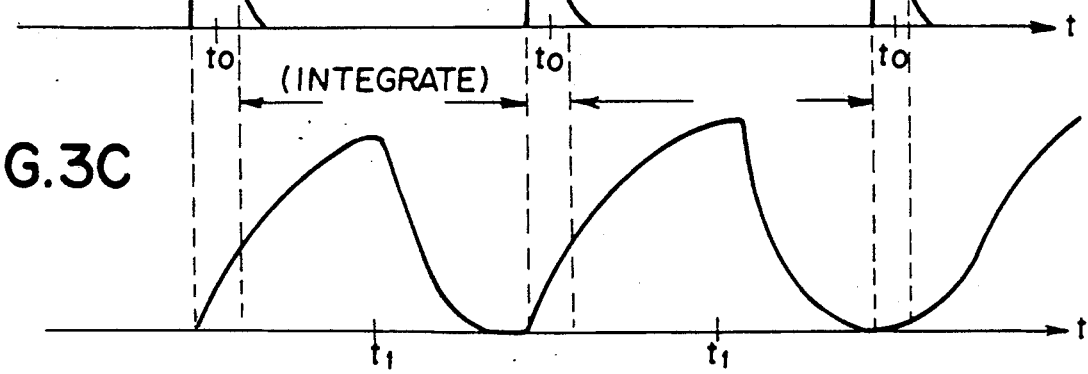
FIG.3C

STIMULABLE PHOSPHOR SHEET AND ENERGY SUBTRACTION PROCESSING METHOD USING THE SAME

BACKGROUND OF THE INVENTION

1. Field of the Invention

This invention relates to an energy subtraction processing method. This invention also relates to a stimulable phosphor sheet which is used for the energy subtraction processing method.

2. Description of the Prior Art

Techniques for reading out a recorded radiation image in order to obtain an image signal, carrying out appropriate image processing on the image signal, and then reproducing a visible image by use of the processed image signal have heretofore been known in various fields. For example, as disclosed in Japanese Patent Publication No. 61(1986)-5193, an X-ray image is recorded on an X-ray film having a small gamma value chosen according to the type of image processing to be carried out, the X-ray image is read out from the X ray film and converted into an electric signal, and the electric signal (image signal) is processed and then used for reproducing the X-ray image as a visible image on a copy photograph or the like. In this manner, a visible image having good image quality with high contrast, high sharpness, high graininess, or the like can be reproduced.

Also, when certain kinds of phosphors are exposed to radiation such as X-rays, $\alpha$-rays, $\beta$-rays, $\gamma$-rays, cathode rays or ultraviolet rays, they store part of the energy of the radiation. Then, when the phosphor which has been exposed to the radiation is exposed to stimulating rays such as visible light, light is emitted by the phosphor in proportion to the amount of energy stored thereon during its exposure to the radiation. A phosphor exhibiting such properties is referred to as a stimulable phosphor. As disclosed in U.S. Pat. Nos. 4,258,264, 4,276,473, 4,315,318, 4,387,428, and Japanese Unexamined Patent Publication No. 56(1981)-11395, it has been proposed to use stimulable phosphors in radiation image recording and reproducing systems. Specifically, a sheet provided with a layer of the stimulable phosphor (hereinafter referred to as a stimulable phosphor sheet) is first exposed to radiation which has passed through an object, such as the human body. In this manner, a radiation image of the object is stored on the stimulable phosphor sheet. The stimulable phosphor sheet, on which the radiation image has been stored, is then scanned with stimulating rays, such as a laser beam, which cause it to emit light in proportion to the amount of energy stored during exposure to the radiation. The light emitted by the stimulable phosphor sheet, upon stimulation thereof, is photoelectrically detected and converted into an electric image signal. The image signal is then used during the reproduction of the radiation image of the object as a visible image on a recording material such as photographic film, on a display device such as a cathode ray tube (CRT), or the like.

Radiation image recording and reproducing systems which use stimulable phosphor sheets are advantageous over conventional radiography using silver halide photographic materials, in that images can be recorded even when the energy intensity of the radiation to which the stimulable phosphor sheet is exposed varies over a wide range. More specifically, since the amount of light which the stimulable phosphor sheet emits when being stimulated varies over a wide range and is proportional to the amount of energy stored thereon during its exposure to the radiation, it is possible to obtain an image having a desirable density regardless of the energy intensity of the radiation to which the stimulable phosphor sheet was exposed. In order for the desired image density to be obtained, an appropriate read-out gain is set when the emitted light is being detected and converted into an electric signal (image signal) to be used in the reproduction of a visible image on a recording material, such as photographic film, or on a display device, such as a CRT.

In the radiation image recording and reproducing systems wherein recording media, such as X-ray film or stimulable phosphor sheets are used, subtraction processing techniques for radiation images are often carried out on image signals detected from a plurality of radiation images of an object which have been recorded on the recording media.

With the subtraction processing techniques for radiation images, an image is obtained which corresponds to a difference between a plurality of radiation images of an object recorded under different conditions. Specifically, a plurality of the radiation images recorded under different conditions are read out at predetermined sampling intervals, and a plurality of image signals thus detected are converted into digital image signals which represent the radiation images. The image signal components of the digital image signals which represent the image information recorded at corresponding sampling points in the radiation images are then subtracted from each other. A difference signal is thereby obtained which represents the image of a specific structure or part of the object represented by the radiation images.

Basically, subtraction processing is carried out with either the so-called temporal (time difference) subtraction processing method or the so-called energy subtraction processing method. In the former method, in order for the image of a specific structure (for example, a blood vessel) of an object to be extracted from the image of the whole object, the image signal representing a radiation image obtained without injection of contrast media is subtracted from the image signal representing a radiation image in which the image of the specific structure (for example, a blood vessel) of the object is enhanced by the injection of contrast media. In the latter method, such characteristics are utilized that a specific structure of an object exhibits different levels of radiation absorptivity with respect to radiation with different energy levels. Specifically, an object is exposed several times to radiation with different energy levels, and a plurality of radiation images are thereby obtained in which different images of a specific structure are embedded. Thereafter, the image signals representing the plurality of the radiation images are weighted appropriately and subjected to a subtraction process in order to extract the image of the specific structure. The applicant proposed novel energy subtraction processing methods using stimulable phosphor sheets in, for example, U.S. Pat. Nos. 4,855,598 and 4,896,037.

With the energy subtraction processing method proposed in U.S. Pat. No. 4,896,037, the operation for recording a radiation image is carried out twice with two kinds of radiation different in energy level, the two radiation images thus recorded are read out, and two digital image signals are thereby obtained. A subtraction process is then carried out on the digital image signals. However, with the proposed method, because a certain length of time occurs between the two operations for recording the radiation images, there is the risk that the object moves during the time interval. As a result, the two radiation images thus recorded do not coincide with each other, and a motion artifact occurs in the visible image reproduced from a difference image signal, which is obtained from the subtraction processing carried out on the image signals representing the two radiation images. Thus a visible image having good image quality cannot be obtained.

Also, even when the object does not move during the two operations for recording the radiation images, troublesome operations are required for the positions of the two radiation images to be adjusted quickly and accurately so that the image signal components of the image signals can be found which represent the image information recorded at corresponding sampling points in the radiation images.

U.S. Pat. No. 4,855,598 discloses an energy subtraction processing method wherein two radiation images to be subjected to the energy subtraction processing are recorded with a single recording operation. With the disclosed method, for example, a filter which exhibits different levels of absorptivity with respect to different radiation energy levels is located between two stimulable phosphor sheets, and the two stimulable phosphor sheets are simultaneously exposed to radiation which has passed through an object. With the disclosed method, no motion artifact due to movement of the object occurs in the visible image reproduced from a difference image signal, which is obtained from the subtraction processing carried out on the image signals representing the two radiation images. However, as in the aforesaid energy subtraction processing method wherein two operations for recording the radiation images are carried out, two stimulable phosphor sheets are used. Therefore, troublesome operations are required for the positions of the two radiation images to be adjusted quickly and accurately so that the image signal components of the image signals can be found which represent the image information recorded at corresponding sampling points in the radiation images. Also, with the disclosed method, the energy subtraction processing cannot be carried out with a high operating efficiency. Specifically, the two stimulable phosphor sheets and a filter located therebetween are housed in a cassette and subjected to the recording operation. After the radiation images have been stored on the two stimulable phosphor sheets but before they are read out from the two stimulable phosphor sheets, the two stimulable phosphor sheets must be taken out of the cassette and respectively loaded into two new cassettes in a darkroom, so that the read-out operation can be carried out on each of the two stimulable phosphor sheets. Such loading operations are troublesome. The loading operations can be carried out automatically. However, in order for the loading operations to be carried out automatically, complicated apparatuses or specific cassettes are necessary.

Novel energy subtraction processing methods have also been proposed in, for example, Japanese Unexamined Patent Publication Nos. 61(1986)-251799 and 61(1986)-251800. With the proposed methods, a single stimulable phosphor sheet is used which is provided with a plurality of stimulable phosphor layers capable of being stimulated with stimulating rays having different wavelengths or capable of emitting light having different wavelengths. However, the proposed methods have the drawbacks in that complicated systems are necessary because, for example, the read-out operation must be carried out on both surfaces of the stimulable phosphor sheet.

SUMMARY OF THE INVENTION

The primary object of the present invention is to provide an energy subtraction processing method which enables the energy subtraction processing to be carried out with a single stimulable phosphor sheet, a single recording operation, and a single read-out operation.

Another object of the present invention is to provide a stimulable phosphor sheet used for the energy subtraction processing method.

The present invention provides a stimulable phosphor sheet comprising a plurality of stimulable phosphors which are mixed together or which take on the form of layers, the plurality of said stimulable phosphors having different response speeds, with which light emission from said stimulable phosphors responds to stimulating rays which cause them to emit light in proportion to the amounts of radiation stored thereon during their exposure to radiation, and having different radiation absorption characteristics which represent absorptivity with respect to energy levels of the radiation.

The term "response speed" as used herein means the time occurring between when the exposure of a stimulable phosphor sheet to stimulating rays is begun and when the level of the light emitted by the stimulable phosphor sheet reaches $A(1-1/e)$, where A denotes the level of the light emitted in the steady state by the stimulable phosphor sheet. Alternatively, the term "response speed" as used herein means the time occurring between when the exposure of a stimulable phosphor sheet to stimulating rays is stopped and when the level of the light emitted by the stimulable phosphor sheet decreases to $A(1/e)$.

The present invention also provides an energy subtraction processing method, which comprises the steps of:

i) storing radiation images of an object on a stimulable phosphor sheet described above by exposing said stimulable phosphor sheet to radiation which has passed through said object, ii) exposing said stimulable phosphor sheet, on which said radiation images have been stored, to pulsed stimulating rays, which cause said stimulable phosphor sheet to emit light in proportion to the amount of energy stored thereon during its exposure to the radiation, iii) detecting the emitted light with different timings corresponding to said response speeds of the plurality of said stimulable phosphors, whereby a plurality of image signals representing said radiation images are obtained, and iv) carrying out subtraction processing for said radiation images on the plurality of said image signals.

As disclosed in, for example, U.S. Pat. No. 4,851,677, various types of stimulable phosphors have heretofore been proposed. The stimulable phosphors have different response speeds and different radiation absorption characteristics. For example, a heavy-element stimulable phosphor represented by the formula $GdOCl:Ce^{3+}$ primarily absorbs X-rays having a high energy level and has a response speed of approximately 0.04 $\mu$sec. A light-element stimulable phosphor represented by the formula SrFCl:Eu$^{2+}$ absorbs little X-rays having a high energy level and has a response speed of approximately 1.0 μsec.

The present invention is based on the findings that different types of stimulable phosphors have different characteristics.

With the energy subtraction processing method in accordance with the present invention, a stimulable phosphor sheet is used which comprises a plurality of stimulable phosphors (for example, a stimulable phosphor represented by the formula GdOCl:Ce$^{3+}$ and a stimulable phosphor represented by the formula SrFCl:Eu$^{2+}$). The plurality of the stimulable phosphors are mixed together take on the form of layers. The plurality of the stimulable phosphors have different response speeds and different radiation absorption characteristics. Radiation images of an object are stored on the stimulable phosphor sheet. Thereafter, the stimulable phosphor sheet, on which the radiation images have been stored, is exposed to pulsed stimulating rays, which cause it to emit light in proportion to the amount of energy stored thereon during its exposure to the radiation. First, the light emitted by a stimulable phosphor, which has the highest response speed among the plurality of the stimulable phosphors of the stimulable phosphor sheet, is detected. Thereafter, the light emitted by a stimulable phosphor, which has a lower response speed, is detected. The light is emitted with different timings by the stimulable phosphors having different radiation absorption characteristics. Therefore, the emitted light is detected with different timings with which it is emitted, and a plurality of image signals representing the radiation images are thus obtained. Accordingly, subtraction processing for the radiation images can then be carried out on the plurality of the image signals. Specifically, the energy subtraction processing can be carried out with a single stimulable phosphor sheet, a single recording operation, and a single read-out operation.

BRIEF DESCRIPTION OF THE DRAWINGS

FIGS. 3A, 3B, and 3C are graphs showing pulsed laser beam irradiated onto a stimulable phosphor sheet and changes in the amount of light emitted by the stimulable phosphor sheet with the passage of time.

DESCRIPTION OF THE PREFERRED EMBODIMENTS

The present invention will hereinbelow be described in further detail with reference to the accompanying drawings.

Figure 1:
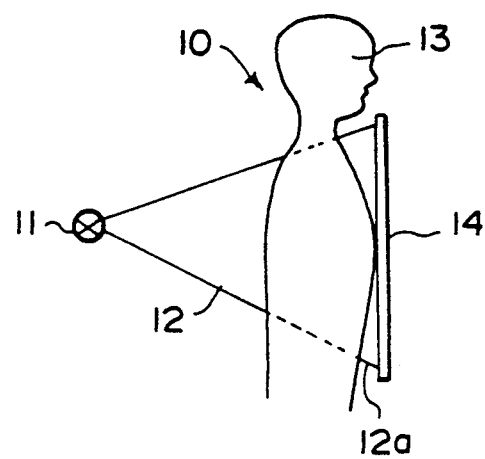
FIG. 1 is a schematic view showing an example of an X-ray image recording apparatus.

With reference to FIG. 1, X-rays 12 are produced by an X-ray source 11 of an X-ray image recording apparatus 10. The X-rays 12 are irradiated onto an object 13, such as a human body. The X-rays 12a, which have passed through the object 13, impinge upon a stimulable phosphor sheet 14. In this manner, X-ray images of the object 13 are stored on the stimulable phosphor sheet 14.

The stimulable phosphor sheet 14 comprises a base material, and a first stimulable phosphor layer and a second stimulable phosphor layer overlaid on the base material. The first stimulable phosphor layer is constituted of a stimulable phosphor represented by the formula GdOCl:Ce$^{3+}$, which absorbs much high-energy components of the X-rays 12 and which has a high response speed. The second stimulable phosphor layer is constituted of a stimulable phosphor represented by the formula SrFCl:Eu$^{2+}$, which absorbs little high-energy components of the X-rays 12 and which has a low response speed.

Therefore, when the X-rays 12a which have passed through the object 13 in the X-ray image recording apparatus 10 impinge upon the stimulable phosphor sheet 14, the high-energy components of the X-rays 12a are primarily absorbed by the stimulable phosphor represented by the formula GdOCl:Ce$^{3+}$, which constitutes the first stimulable phosphor layer. The low-energy components of the X-rays 12a are primarily absorbed by the stimulable phosphor represented by the formula SrFCl:Eu$^{2+}$, which constitutes the second stimulable phosphor layer.

Figure 2:
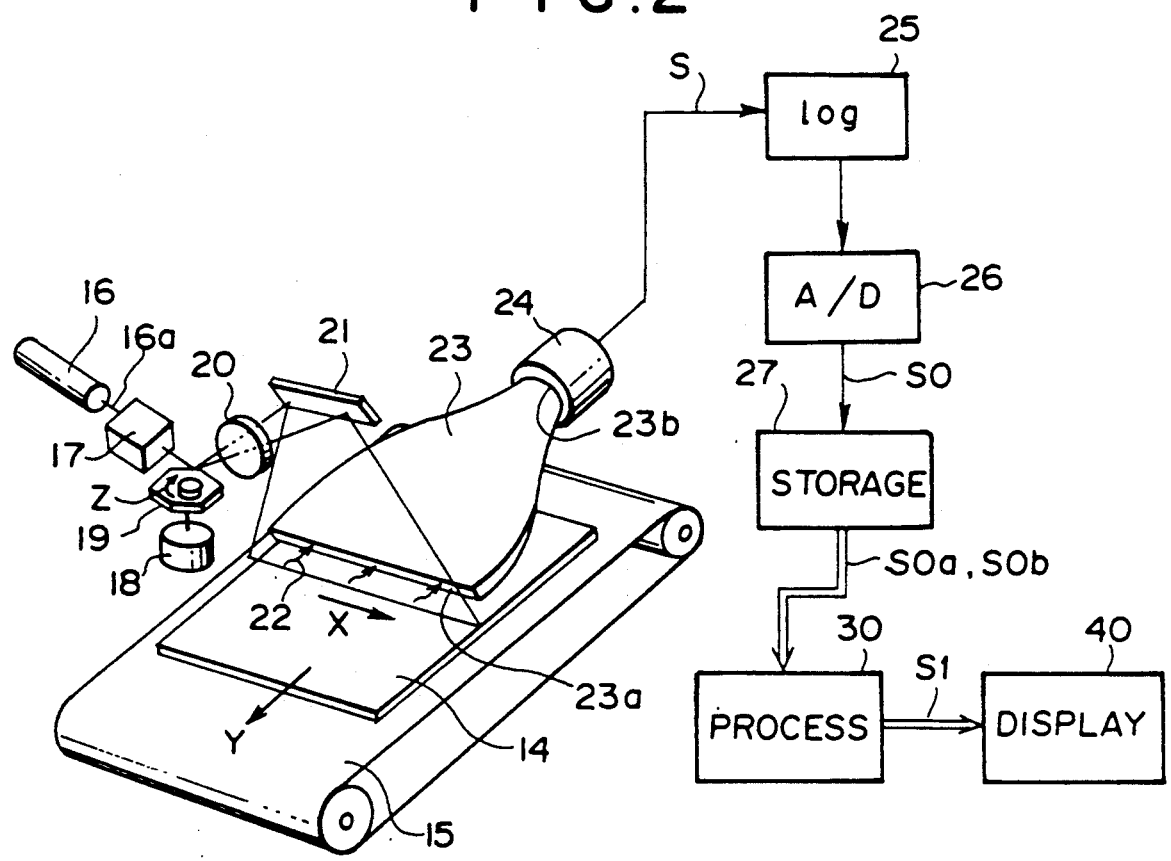
FIG. 2 is a perspective view showing an example of an X-ray image read-out apparatus.

FIG. 2 is a perspective view showing an example of an X-ray image read-out apparatus.

With reference to FIG. 2, the stimulable phosphor sheet 14, on which the X-ray images have been stored in the X-ray image recording apparatus shown in FIG. 1 in the manner described above, is placed at a predetermined position in the X-ray image read-out apparatus.

The stimulable phosphor sheet 14 is conveyed in a sub-scanning direction indicated by the arrow Y by a sheet conveyance means 15, which is constituted of an endless belt or the like and which is operated by an operating means (not shown). A laser beam 16a, which serves as stimulating rays, is produced by a laser beam source 16 and is converted into a pulsed laser beam 16a by an acousto-optic modulator 17 (AOM). The pulsed laser beam 16a is reflected and deflected by a rotating polygon mirror 19, which is being quickly rotated by a motor 18 in the direction indicated by the arrow Z. The pulsed laser beam 16a then passes through a converging lens 20, which is constituted of an fθ lens or the like. The direction of the optical path of the pulsed laser beam 16a is then changed by a mirror 21, and the pulsed laser beam 16a is caused to impinge upon the stimulable phosphor sheet 14 and scan it in a main scanning direction indicated by the arrow X. The main scanning direction is approximately normal to the sub-scanning direction indicated by the arrow Y. When the stimulable phosphor sheet 14 is exposed to the pulsed laser beam 16a, the exposed portion of the stimulable phosphor sheet 14 emits light 22 in an amount proportional to the amount of energy stored thereon during its exposure to the X-rays 12a. The emitted light 22 is guided by a light guide member 23, and photoelectrically detected by a photomultiplier 24. The light guide member 23 is made from a light guiding material, such as an acrylic plate. The light guide member 23 has a linear light input face 23a, positioned to extend along the main scanning line on the stimulable phosphor sheet 14, and a ring-shaped light output face 23b, positioned so that it is in close contact with a light receiving face of the photomultiplier 24. The emitted light 22, which has entered the light guide member 23 from its light input face 23a, is guided through repeated total reflection inside of the light guide member 23, emanates from the light output face 23b, and is received by the photomultiplier 24. In this manner, the amount of the emitted light 22, which amount represents the image information stored on the stimulable phosphor sheet 14, is converted into an electric signal by the photomultiplier 24.

An analog signal S generated by the photomultiplier 24 is logarithmically amplified by a logarithmic amplifier 25, and fed into an A/D converter 26. The A/D converter 26 samples the analog signal S with a predetermined timing which is synchronized to the respective pulses of the pulsed laser beam 16a. The sampled signal is converted into a digital image signal S0. The image signal S0 thus obtained is stored in a storage means 27.

FIGS. 3A, 3B, and 3C are graphs showing the pulsed laser beam 16a irradiated onto the stimulable phosphor sheet 14 and changes in the amount of light emitted by the stimulable phosphor sheet 14 with the passage of time. In FIGS. 3A, 3B, and 3C, the horizontal axes represent the time t, and the vertical axes represent the amount of light.

FIG. 3A shows the pulsed laser beam 16a irradiated onto the stimulable phosphor sheet 14. The laser beam 16a is modulated as shown in FIG. 3A by the AOM 17, which is shown in FIG. 2, such that the laser beam 16a impinges pulse-wise upon the stimulable phosphor sheet 14 at intervals corresponding to the picture elements in the X-ray images stored on the stimulable phosphor sheet 14.

FIG. 3B shows the change in the amount of light emitted by the first stimulable phosphor layer of the stimulable phosphor sheet 14 with the passage of time. FIG. 3C shows the change in the amount of light emitted by the second stimulable phosphor layer of the stimulable phosphor sheet 14 with the passage of time.

The A/D converter 26 shown in FIG. 2 samples the analog signal S with two timings, i.e. with the timing t0 and the timing t1, per pulse in synchronization with each pulse of the laser beam 16a. The sampled analog signal S is then digitized into the digital image signal S0. Of the digital image signal S0 generated by the A/D converter 26, an image signal S0a (shown in FIG. 2) which has been obtained from the sampling carried out with the timing t0 primarily represents the amount of light emitted by the first stimulable phosphor layer. Therefore, the image signal S0a represents the X-ray image stored primarily from the high-energy components of the X-rays 12 shown in FIG. 1. Of the digital image signal S0, an image signal S0b (shown in FIG. 2) which has been obtained from the sampling carried out with the timing t1 represents the X-ray image stored primarily from the low-energy components of the X-rays 12 shown in FIG. 1.

Reverting to FIG. 2, the two image signals S0a and S0b thus obtained are (i.e. the image signal S0 is) stored in the storage means 27, and are then fed therefrom into an image processing apparatus 30. The image processing apparatus 30 carried out subtraction processing on the image signals S0a and S0b. Specifically, the image processing apparatus 30 weights the image signals S0a and S0b, and subtracts the image signal components of the weighted image signals from each other which represent the image information stored at corresponding sampling points in the two X-ray images. Thus an image signal S1 is obtained, which can be expressed as $$S1 = W_a \cdot S0a - W_b \cdot S0b + C$$

where $W_a$ and $W_b$ each denote a weighting coefficient, and C denotes a bias component. The image signal S1 represents an image corresponding to the difference between the X-ray image, which is represented by the image signal S0a and which was stored from the high-energy components of the X-rays, and the X-ray image, which is represented by the image signal S0b and which was stored from the low-energy components of the X-rays. The image signal S1 is fed from the image processing apparatus 30 into an image display apparatus 40, which reproduces a visible image (an energy subtraction image) from the image signal S1 and displays it.

In the embodiment described above, the stimulable phosphor represented by the formula $GdOCl:Ce^{3+}$ and the stimulable phosphor represented by the formula $SrFCl:Eu^{2+}$ are used. However, in the present invention, various other stimulable phosphors may be used which have different X-ray (radiation) absorption characteristics and different response speeds. Also, in the aforesaid embodiment, the stimulable phosphor sheet is provided with two stimulable phosphor layers. Alternatively, the stimulable phosphor sheet may be provided with a single stimulable phosphor layer containing a mixture of a plurality of stimulable phosphors having different radiation absorption characteristics and different response speeds.

Also, in the embodiment described above, the source of the pulsed laser beam is constituted of the AOM and the laser which continuously produces the laser beam. Alternatively, one of various solid state lasers, semiconductor lasers, cathode ray-excited lasers, dye lasers which can produce laser beams pulse-wise may be employed.

Instead of the sampling being carried out with the timing t0 and the timing t1, image signal components obtained by integrating the signal values occurring between the time T1 and the time T2 shown in FIG. 3 may be taken as the quick response components, and image signal components obtained by integrating the signal values occurring between the time T2 and the time T1 shown in FIG. 3 may be taken as the slow response components.

I claim:

1. A stimulable phosphor sheet, comprising a plurality of stimulable phosphors which are mixed together or which take on the form of layers, the plurality of said stimulable phosphors include at least a first stimulable phosphor represented by the formula $GdOCl:Ce^{3+}$ and a second stimulable phosphor represented by the formula $SrFCl:Eu^{2+}$, the plurality of said stimulable phosphors having different response speeds, with which light emission from said stimulable phosphors responds to stimulating rays which cause them to emit light in proportion to the amounts of radiation stored thereon during exposure to radiation, and having different radiation absorption characteristics which represent absorptivity with respect to energy levels of the radiation.

2. A stimulable phosphor sheet as defined in claim 1 wherein said radiation is X-rays.

3. An energy subtraction processing method, which comprises the steps of:
   i) storing radiation images of an object on a stimulable phosphor sheet, having a plurality of stimulable phosphors with different response speeds, by exposing said stimulable phosphor sheet to radiation which has passed through said object,
   ii) exposing said stimulable phosphor sheet, on which said radiation images have been stored, to pulsed stimulating rays, which cause said stimulable phosphor sheet to emit light in proportion to the amount of energy stored thereon during its exposure to the radiation, iii) detecting the emitted light with different timings corresponding to said response speeds of the plurality of said stimulable phosphors, whereby a plurality of image signals representing said radiation images are obtained, and iv) carrying out subtraction processing for said radiation images on the plurality of said image signals.

4. A method as defined in claim 3 wherein the plurality of said stimulable phosphors are a stimulable phosphor represented by the formula $GdOCl:Ce^{3+}$ and stimulable phosphor represented by the formula $SrFCl:Eu^{2+}$.

5. A method as defined in claim 3 wherein said radiation images are X-ray images.

6. A method as defined in claim 3 wherein said stimulating rays are a laser beam.

7. A method as defined in claim 3, wherein the plurality of said stimulable phosphors includes a first stimulable phosphor having a high response speed and a second stimulable phosphor having a low response speed.

8. A method as defined in claim 7, wherein said detecting in step (iii) comprises the steps of:
  (a) detecting a high-energy component of the emitted light from the first stimulable phosphor; and
  (b) detecting a low-energy component of the emitted light from the second stimulable phosphor.

9. A method as defined in claim 8, wherein said detecting in step (a) is performed using a first timing and said detecting in step (b) is performed using a second timing, the second timing being greater than the first timing.

* * * * *